(12) United States Patent
Harney

(10) Patent No.: US 10,420,260 B2
(45) Date of Patent: Sep. 17, 2019

(54) ELECTROMAGNETIC INTERFERENCE SHIELDING SHEET MOLDING COMPOSITION

(71) Applicant: Magna International Inc., Aurora (CA)

(72) Inventor: William Joseph John Harney, Toronto (CA)

(73) Assignee: Magna International Inc., Aurora (CA)

(*) Notice: Subject to any disclaimer, the term of this patent is extended or adjusted under 35 U.S.C. 154(b) by 932 days.

(21) Appl. No.: 13/850,710

(22) Filed: Mar. 26, 2013

(65) Prior Publication Data

US 2013/0248241 A1 Sep. 26, 2013

Related U.S. Application Data

(60) Provisional application No. 61/615,622, filed on Mar. 26, 2012.

(51) Int. Cl.
*H05K 9/00* (2006.01)

(52) U.S. Cl.
CPC ........... *H05K 9/009* (2013.01); *H05K 9/0083* (2013.01)

(58) Field of Classification Search
None
See application file for complete search history.

(56) References Cited

U.S. PATENT DOCUMENTS

| | | |
|---|---|---|
| 4,568,505 A | 2/1986 | Bollen et al. |
| 5,126,085 A | 6/1992 | Thorp et al. |
| 5,366,664 A * | 11/1994 | Varadan ............ H01B 1/20 106/1.18 |
| 5,601,770 A | 2/1997 | Maligie |
| 6,508,906 B1 | 1/2003 | Bradish |
| 6,901,986 B2 | 6/2005 | Bradish |
| 2003/0166744 A1* | 9/2003 | Van Dijk ............ C08K 7/06 523/215 |
| 2006/0110599 A1* | 5/2006 | Honma ............ B32B 5/10 428/413 |

(Continued)

FOREIGN PATENT DOCUMENTS

| | | | |
|---|---|---|---|
| JP | 2001139831 A | * | 5/2001 |
| JP | 2004174599 A | | 6/2004 |
| JP | 2007110138 A | | 4/2007 |

(Continued)

OTHER PUBLICATIONS

Hirose et al., Carbon Fiber Based Bulk Molding Compound Material and Molded Article, May 22, 2001, machine translation of JP2001-139831 (Year: 2001).*

(Continued)

*Primary Examiner* — Chinessa T. Golden

(74) *Attorney, Agent, or Firm* — Warn Partners, P.C.

(57) ABSTRACT

In accordance with the present invention, there is provided an electromagnetic shielding composition. The electromagnetic shielding composition in accordance with the broad aspects of the present invention includes from about 40% to 60% by volume of a sheet molding composition filled with an effective amount of carbon fibers for shielding of electromagnetic radiation from the electrical systems in an at least partially electrically driven vehicle.

13 Claims, 2 Drawing Sheets

(56) References Cited

U.S. PATENT DOCUMENTS

2011/0263778 A1* 10/2011 Honma ................. C08L 23/10
524/495

FOREIGN PATENT DOCUMENTS

| | | |
|---|---|---|
| JP | 2008034823 A | 2/2008 |
| JP | 2009191425 A | 8/2009 |
| JP | 2011093213 A | 5/2011 |
| WO | 2011157528 A1 | 12/2011 |

OTHER PUBLICATIONS

Hongu, H., Kikutani, T., Takatera, M., Takahashi, H., Naruse, N., Hamada, K., Hara, K., Minemura, N., "Encyclopedia of Fibers," pp. 78, 79, 87, 88, Mar. 25, 2002.

* cited by examiner

ELECTROMAGNETIC INTERFERENCE SHIELDING SHEET MOLDING COMPOSITION

This application claims the benefit of U.S. Provisional Application No. 61/615,622, filed Mar. 26, 2012.

FIELD OF THE INVENTION

The present invention relates to shielding of electromagnetic interference in electric and hybrid vehicles. More particularly, the present invention relates to a sheet molding composition useful in electromagnetic shielding of components in a vehicle.

BACKGROUND OF THE INVENTION

Managing electric fields generated in vehicles has long been a consideration when building vehicles with internal combustion engines. Any time current is generated in an electrical system, there is also a subsequent electric field related to the current generation. These fields can interfere with other electrical components and systems in a vehicle.

Certain electrical components are more sensitive to the fields than others. For instance, in operating a vehicle radio on AM or FM bands, spark plug interference is prevalent at times. Resistance spark plugs knocks down the interference as well as using spark plug wires designed to reduce background electrical noise.

As vehicle systems and society in general become increasingly reliant on electrical controls and monitoring cages and systems, the need to further manage and limit electromagnetic interference has also become much more important and even critical to ensuring correct operation of electrical devices in or in close proximity to the vehicle.

With the advent of electric hybrid and pure electric powered vehicles, the current used in such vehicles is magnitudes more than used in conventional vehicles. The motors used and the batteries, wires, relays solenoids and other components must be extremely robust in order to effectively and reliably handle the electrical energy necessary to power and run the systems in the vehicle. Therefore, the electric fields produced by these systems have increased. While modern engineering and materials have helped control some of the electrical field emissions, there remains a need to further control and or shield or isolate gauges, radios, lighting, and occupants from the electrical fields generated.

In particular, most EV batteries, battery management systems, traction motor controllers and DC-DC converters are connected to devices or are devices that are switching high power (up to 100 kW or more) at high frequencies (20-50 kHz). This results in electromagnetic fields, at these frequencies and harmonics, that may radiate from the devices and these radiations could interfere with safety, communication, and entertainment equipment. This could occur both on board and off board the vehicle. The allowable level of emissions is controlled through regulation (e.g., FCC) and product performance specifications.

Standard practice in enclosure design is to use metals or coat plastic or composite enclosures with metal. Semi-structural battery housings used in these vehicles have used glass reinforced SMC with a shielding layer, typically copper. This is a robust yet expensive and heavy solution. Therefore, there remains a need in the art to replace heavy and expensive copper shielding designs with a more cost effective and lighter material without sacrificing shielding characteristics.

SUMMARY OF THE INVENTION

In accordance with the present invention, there is provided an electromagnetic shielding composition. The electromagnetic shielding composition in accordance with the broad aspects of the present invention includes from about 40% to 60% by volume of a Sheet Molding composition filled with an effective amount of carbon fibers for shielding of electromagnetic radiation from the electrical systems in an at least partially electrically driven vehicle.

Also provided in the present invention is a process for making an electromagnetic shield for a component of an electrical vehicle. In the process of the present invention, an electromagnetic shielding composition in the form of a sheet is formulated. The electrical shielding composition includes from about 40% to 60% by volume of a sheet molding composition filled with an effective amount of carbon fibers for shielding of electromagnetic radiation from the electrical systems in an at least partially electrically driven vehicle. Thereafter, an electromagnetic shield for a part is produced by forming and curing the sheet of electromagnetic shielding composition into a shape effective for following the form of a component to be shielded.

Using carbon fiber as a reinforcement in place of glass and reduce the mass of the part through the lower density and higher strength of carbon fiber. The present invention also eliminates the copper cladding in prior designs by taking advantage of the potential of carbon fiber to attenuate EMI. This would further reduce mass of parts manufactured and partially off-set the cost of the carbon fiber.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

The following description of the preferred embodiment(s) is merely exemplary in nature and is in no way intended to limit the invention, its application, or uses.

Figure 1:
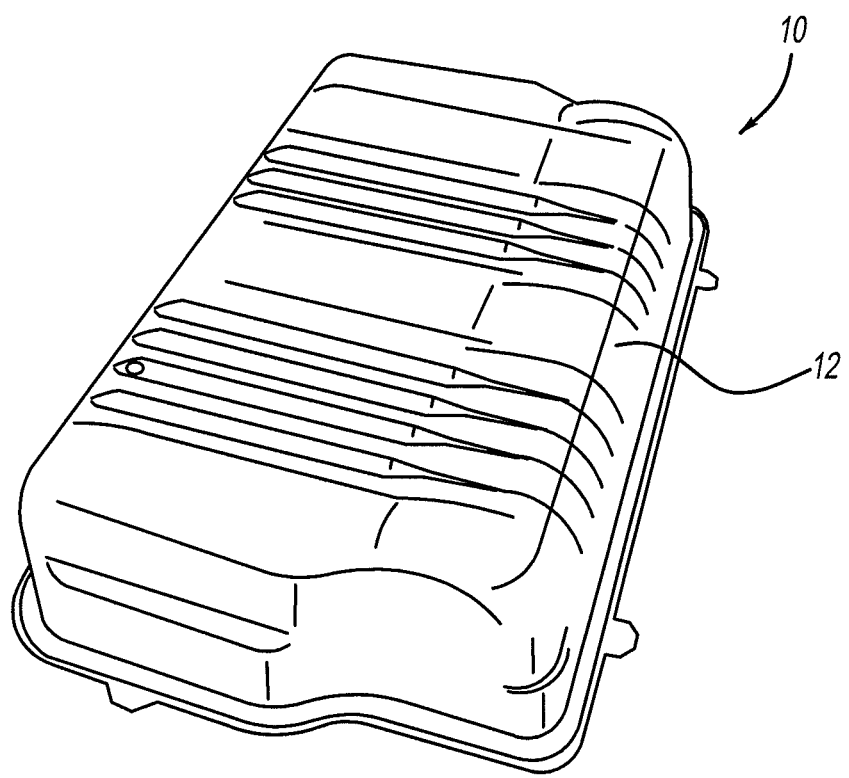
FIG. 1 is a view of a typical part manufactured in accordance with the teachings of the present invention.

Referring now to the drawings, in accordance with the present invention, there is provided an electromagnetic shielding composition, generally shown at 10 for molding of a shield 12 of an electrical component of a vehicle not shown. The shield 12 shown in FIG. 1 is a cover for a battery box of an electric vehicle. The sheet molding composition of the present invention provides molding of complicated shape applications. The material is compatible with epoxy resins and unidirectional fiber formats for local reinforcement. It also is E-coat temperature capable with long term stability.

The electromagnetic shielding composition, in accordance with the broad aspects of the present invention, includes from about 40% to 60% by volume of a Sheet Molding composition filled with an effective amount of carbon fibers for shielding of electromagnetic radiation from the electrical systems in an at least partially electrically driven vehicle. Generally, from about 60% to about 40% of a shielding carbon fiber material. Typically, in from about 45% to about 55% SMC blended with from about 55% to about 45% carbon fiber is used with a particularly preferred ratio of about 50% SMC and 50% carbon fiber.

Figure 2:
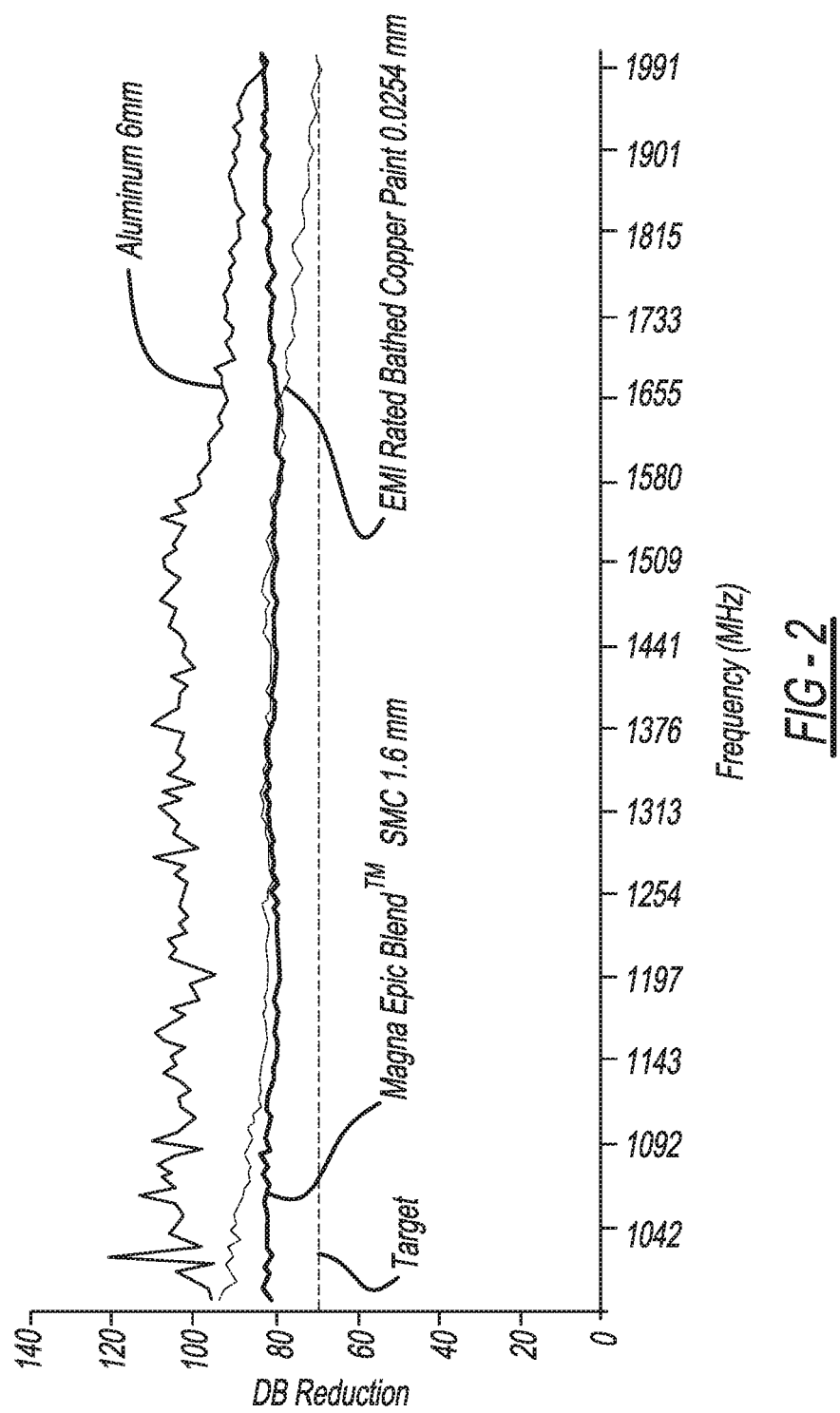
FIG. 2 is a chart showing the EMI shielding of an SMC composition made in accordance with the teachings of the present invention.

As best shown in FIG. 2, compounded sheets, made in accordance with the present invention, are typically from about 0.5 mm to about 10 mm thick depending on the shielding desired preferred sheets are 1 mm to 2 mm thick. The shielding generated is from about a 65 to 85 decibel reduction from a 1-2 mm thickness over a frequency range of 1000 MHz to 2000 MHz.

A particularly preferred SMC compound is a Magna EPIC Blend™ SMC composition available from Magna International, Novi, Mich. The SMC is a Vinyl Ester type sheet molding composition. Other fillers, additives and components may be included in minor amounts provided they do not affect the physical and particularly the electric field shielding properties of the present invention.

The properties of the resulting composition are set forth below in Table 1:

TABLE 1

Properties of EMI SMC of the present invention

| Specific Gravity | 1.41 |
| --- | --- |
| Carbon Fiber | 50% (by weight) |
| Fiber Length | 25 mm |
| Fiber Orientation | random |
| Tensile Modulus | 30 GPa |
| Tensile Strength | 200 MPa |
| Flexural Modulus | 26 GPa |
| Flexural Strength | 460 MPa |
| Moisture Absorption | <0.2% |
| Mold Shrink | 0.0001 mm/mm |

Carbon fibers selected for the present invention are those suitable for formulation with the SMC chosen and which provide suitable shielding properties.

A particularly preferred material for use in the present invention is a Panex (circle R) 35 continuous Tow (50K) 35 carbon fiber material available from Zoltek Companies, Inc. St. Louis, Mo. This material is a 50 K filament fiber manufactured from polyacrylonitrile precursor. The material has a tensile strength of 600 KSI, a tensile modulus of 35 Msi, an electrical resistivity of 0.00061 ohm-in, a fiber diameter of 0.283 mils, a carbon content of 95%, and a yield of 400 ft/lb.

In accordance with the process aspects of the present invention, there is provided a process for making an electromagnetic shield for a component of an electrical vehicle. The first step is to provide an electromagnetic shielding composition in the form of a sheet. Blending of SMC and chopped carbon fibers are used in the present invention. As set forth above, electrical shielding composition including from about 40% to 60% by volume of a sheet molding composition is filled with an effective amount of carbon fibers for shielding of electromagnetic radiation from the electrical systems in an at least partially electrically driven vehicle and is formed into a sheet. The sheet is thereafter formed into a predetermined shape and then cured at a tool temperature of about 150 degrees C. The sheet of electromagnetic shielding composition is formed into a shape effective for following the form of a component to be shielded.

The component to be shielded is either an electrical component to be installed in a vehicle such as a radio, gauge, control unit or the like which would have a shielded housing. Or the shielding may be formed in a shape to cover a motor, feed wire, battery, a group of batteries, a wire, a wiring harness or other heavy current using systems. It may be particularly desirable to provide contoured shields for control units in the electric vehicle such as an engine control unit, a computer device, a transmission control unit, a charging control unit.

EXAMPLE

Shielded Sheet Molding compositions are made in containing 40% 45%, 50%, 55% and 60% Sheet molding composition with the remainder carbon fibers 1 inch to about 3 inches long and ranging from 0.5 mm to 10 mm thick and 1 mm to 2 mm thicknesses. Decibel reductions are found to be 65-85 over a frequency range of 1000 Mhz to 2000 Mhz. Sheets and parts are formed of the material and cured at a temperature of about 150 degrees C. The parts are found effective in electromagnetic shielding of parts in an electric and hybrid vehicle.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. An electromagnetic shielding composition comprising:
   from about 40% to 60% by volume of a mono layer sheet molding composition (SMC) filled with an effective amount of carbon fibers for shielding of electromagnetic radiation from the electrical systems in an at least partially electrically driven vehicle,
   wherein the carbon fiber is a 50K filament fiber manufactured from polyacrylonitrile precursor,
   wherein the carbon fiber has a tensile strength of 600 KSI, tensile modulus of 35 Msi, carbon content of about 95% and fiber diameter of about 0.283 mils,
   wherein the carbon fibers are from about 1 inch to about 3 inches in length and are amorphously distributed in the composition, and
   wherein the carbon fiber is a chopped carbon fiber introduced using unstructured.

2. The electromagnetic shielding composition of claim 1 wherein said carbon fibers are found in the composition in amounts of from about 60% to 40% by volume.

3. The electromagnetic shielding composition of claim 1, wherein the effective amount of shielding is from about a 65 to 85 decibel reduction from a 1-2 mm thickness over a frequency range of 1000 MHz to 2000 MHz.

4. The electromagnetic shielding composition of claim 1 wherein about 50% by volume SMC is filled with about 50% by volume carbon fibers.

5. An electromagnetic shielding composition comprising:
   from about 40% to 60% by volume of a mono layer sheet molding composition (SMC) filled with an effective amount of carbon fibers of from about 60% to 40% by volume, wherein the carbon fiber is a 50K filament fiber manufactured from polyacrylonitrile precursor, and wherein the carbon fiber has a tensile strength of 600 KSI tensile modulus of 35 Msi, carbon content of about 95% and fiber diameter of about 0.283 mils, and wherein the carbon fibers are from about 1" to about 3" in length and are amorphously distributed in the composition providing for an effective amount of shielding of from about a 65 to 85 decibel reduction from a 1-2 mm thickness over a frequency range of 1042 MHz to 2000 MHz for shielding of electromagnetic radiation from the electrical systems in an at least partially electrically driven vehicle, wherein the carbon fiber is a chopped carbon fiber introduced using unstructured tow to provide predetermined electromagnetic interference/electromagnetic compatibility shielding and predetermined structural performance of large three dimensional enclosures formed from said composition.

6. The electromagnetic shielding composition of claim 5 wherein from about 50% by volume SMC is filled with about 50% by volume carbon fibers.

7. The electromagnetic shielding composition of claim 5 wherein from about 45% to 55% by volume SMC is filled with about 55% to 45% by volume carbon fibers.

8. The electromagnetic shielding composition of claim 5 said three dimensional enclosure formed of the composition has a thickness of from about 0.5 mm to about 10 mm.

9. The electromagnetic shielding composition of claim 5 said three dimensional enclosure formed of the composition has a thickness of from about 1 mm to about 2 mm.

10. A process for making an electromagnetic shield for a component of an electrical vehicle comprising the steps of:
   a.) providing an electromagnetic shielding composition in the form of a sheet, said electrical shielding composition including from about 40% to 60% by volume of a Sheet Molding composition filled with an effective amount of carbon fibers for shielding of electromagnetic radiation from the electrical systems in an at least partially electrically driven vehicle; and
   b.) forming and curing the sheet of electromagnetic shielding composition into a shape effective for following the form of a component to be shielded;
wherein the carbon fiber is a 50K filament fiber manufactured from polyacrylonitrile precursor,
wherein the carbon fiber has a tensile strength of 600 KSI, tensile modulus of 35 Msi, carbon content of about 95% and fiber diameter of about 0.283 mils,
wherein the carbon fibers are from about 1 inch to about 3 inches in length and are amorphously distributed in the composition, and
wherein the carbon fiber is a chopped carbon fiber introduced using unstructured tow.

11. The process for making an electromagnetic shield for a component of an electrical vehicle of claim 10, further comprising installing the component on the vehicle.

12. The process for making an electromagnetic shield for a component of an electrical vehicle of claim 10 wherein the component to be shielded is selected from the group comprising a battery, a group of batteries, a wire, a wiring harness, a vehicle gauge, a radio, a control unit, another component requiring to be shielded.

13. The process for making an electromagnetic shield for a component of an electrical vehicle of claim 10 wherein about 50% by volume SMC is filled with about 50% by volume carbon fibers.

* * * * *